United States Patent
Matsuoka

(10) Patent No.: US 9,064,413 B2
(45) Date of Patent: Jun. 23, 2015

(54) METHOD AND SYSTEM FOR APPLICATION CONTROL

(75) Inventor: Hiromichi Matsuoka, Obu (JP)

(73) Assignee: DENSO CORPORATION, Kariya (JP)

(*) Notice: Subject to any disclaimer, the term of this patent is extended or adjusted under 35 U.S.C. 154(b) by 2100 days.

(21) Appl. No.: 11/520,596

(22) Filed: Sep. 14, 2006

(65) Prior Publication Data

US 2007/0100510 A1 May 3, 2007

(30) Foreign Application Priority Data

Oct. 25, 2005 (JP) .................................. 2005-309906

(51) Int. Cl.
*G06F 19/00* (2011.01)
*G08G 1/0968* (2006.01)
*G01C 21/26* (2006.01)
*G07C 5/08* (2006.01)

(52) U.S. Cl.
CPC .......... *G08G 1/096877* (2013.01); *G01C 21/26* (2013.01); *G07C 5/085* (2013.01); *H03J 2200/12* (2013.01)

(58) Field of Classification Search
USPC ......... 701/209, 204, 207, 208, 408, 409, 445, 701/446, 450, 468, 491, 526, 532, 541; 340/995.19; 342/457; 707/100, 602, 707/661, 665, 667, 668
See application file for complete search history.

(56) References Cited

U.S. PATENT DOCUMENTS

| | | | | |
|---|---|---|---|---|
| 5,898,680 A * | 4/1999 | Johnstone et al. | ............ | 370/316 |
| 6,035,400 A | 3/2000 | Yasuoka | | |
| 6,061,003 A | 5/2000 | Harada | | |
| 6,760,652 B2 | 7/2004 | Ogasawara | | |
| 7,103,854 B2 * | 9/2006 | Fuchs et al. | .................. | 715/855 |
| 7,197,500 B1 * | 3/2007 | Israni et al. | .................. | 707/809 |
| 2001/0052121 A1 | 12/2001 | Masuda et al. | | |
| 2003/0222820 A1 * | 12/2003 | Karr et al. | ..................... | 342/457 |
| 2004/0148098 A1 * | 7/2004 | Yato | ............................. | 701/209 |
| 2004/0267441 A1 | 12/2004 | Kim | | |
| 2005/0165543 A1 * | 7/2005 | Yokota | ......................... | 701/204 |

FOREIGN PATENT DOCUMENTS

| | | |
|---|---|---|
| DE | 199 32 797 | 1/2001 |
| EP | 1 544 576 | 6/2005 |
| JP | A-10-208194 | 8/1998 |
| JP | 11108685 | * 4/1999 |
| JP | A-2004-125903 | 4/2004 |

OTHER PUBLICATIONS

Office Action dated Dec. 18, 2008 in corresponding Australian patent application No. 2006 213977.

(Continued)

*Primary Examiner* — Ronnie Mancho
(74) *Attorney, Agent, or Firm* — Posz Law Group, PLC

(57) ABSTRACT

An application control system for use in a vehicle includes a current region detector for detecting a current region where the vehicle is operating, an application storage for storing a regional application software in association with a preset region and a control unit for retrieving and executing the regional application software stored in the application storage based on the current region detected by the current region detector. The control unit retrieves and executes the regional application software when the current region is identified as the preset region.

22 Claims, 6 Drawing Sheets

(56) References Cited

OTHER PUBLICATIONS

Office Action dated Jun. 26, 2009 in corresponding Chinese patent application No. 200610136561X (English translation enclosed).

Office Action dated Aug. 21, 2012 in corresponding DE Patent Application No. 10 2006 049 902.6 (and English translation).

Office Action dated Aug. 20, 2010 in corresponding Chinese patent application No. 200610136561.X (English translation enclosed).

* cited by examiner

METHOD AND SYSTEM FOR APPLICATION CONTROL

CROSS REFERENCE TO RELATED APPLICATION

This application is based on and claims the benefit of priority of Japanese Patent Application No. 2005-309906 filed on Oct. 25, 2005, the disclosure of which is incorporated herein by reference.

FIELD OF THE INVENTION

The present invention generally relates to a vehicular navigation system.

BACKGROUND OF THE INVENTION

In recent years, a navigation system uses an application software for retrieving map data from information medium such as DVD-ROM or the like and displaying it on a display unit. In this case, the application software has to be switched depending on a format of the map data provided by the DVD-ROM. For example, when the map data is prepared by using a format 1.0 in a region A and by using a format 2.0 in a region B, different types of application software have to be used respectively in each of the region A and region B to accommodate the difference of data format. The map data in each of the format 1.0 and format 2.0 is retrieved from the medium such as the DVD-ROM, a HDD or the like and is loaded in a memory under a control of a CPU when a user, or a driver of a vehicle, uses the navigation system. The application software used in the navigation system is also retrieved from the medium to the memory of the navigation system.

The application software executed in, for example, a substrate 1 of the navigation system in FIG. 7A is conventionally determined based on an input of a divided voltage Vd that is applied to a reference input terminal of a CPU 2 after dividing a source voltage Vc by using a series circuit of resistors 3, 4. That is, the CPU 2 determines the application software to be used in the navigation system based on the input of a signal that is derived from A/D conversion of the divided voltage Vd. The input to the CPU 2 may be provided as an ID code from a ROM 5 coupled with the CPU 2 when the navigation system is initialized.

Thus, the conventional navigation system has to have a different product series for respective regions (i.e., for respective data formats) due to above-described operation scheme. That is, the navigation system having the application software designated for each region has to be produced as a different series of products because the application software for a specific region (i.e., for a specific data format) is selected and determined based on a product code of the navigation system. As a result, an increased number of versions of the navigation system leads to a complicated situation such as a version control in a production operation, an inventory operation or the like.

The navigation system disclosed in Japanese patent document JP-A-H10-208194 has an operation scheme that the navigation system in operation determines and switches product specifications based on a current position of the navigation system detected by using map data.

However, the navigation system in the above disclosure suffers from difference of map data format. That is, the navigation system does not work properly when the map data for the current position is provided in a format that is not compatible with the application software used in the navigation system.

SUMMARY OF THE INVENTION

In view of the above-described and other problems, the present disclosure provides an application control system that uses different types of application software for different regions without compromising usability in trans-regional use and simplicity in product version control.

In one aspect of the present disclosure, the application control system for use in a vehicle includes a current region detector for detecting a current region where the vehicle is operating, an application storage for storing a regional application software in association with a preset region and a control unit for retrieving and executing the regional application software stored in the application storage based on the current region detected by the current region detector. The control unit retrieves and executes the regional application software when the current region is identified as the preset region.

The application control system having the operation scheme described above can retrieve a different type of the application software for different region, thereby enabling a single model of a specific product (e.g., a navigation system) to cover multiple regions that requires respectively different types of application software. Therefore, production cost of the product is reduced.

Further, the control unit controls the retrieval of the application software that is suitable to the region where the specific product is operated for the first time. In this manner, the suitability of the application software to the region of the operation is securely guaranteed.

In another aspect of the present disclosure, the application software is adaptively switched by the application control system according to the region where the application software is operated. In this manner, execution of the application software is always suitably maintained to the region of the operation even when a parent system of the application software travels from region to region.

In yet another aspect of the present disclosure, the switching timing of the application software is adaptively controlled based on a predetermined condition such as a travel distance, a travel time of the parent system. In this manner, stable execution of the application software and the parent system is guaranteed even when the parent system of the application software frequently crosses a border of the different regions. In addition, the predetermined condition can be controlled to achieved an improved operation condition of the application software and/or the parent system.

BRIEF DESCRIPTION OF THE DRAWINGS

Other objects, features and advantages of the present invention will become more apparent from the following detailed description made with reference to the accompanying drawings, in which.

DETAILED DESCRIPTION OF THE PREFERRED EMBODIMENTS

Embodiments of the present disclosure are described with reference to the drawings. The embodiments of the present disclosure are not necessarily limited to the types/forms in the present embodiment, but may take any form of the art or technique that is regarded within the scope of the present disclosure by artisans who have ordinary skill in the art.

(First Embodiment)

A first embodiment of an application control system in the present disclosure is described as a vehicle navigation system with reference to FIGS. 1 to 4.

Figures 1, 3:
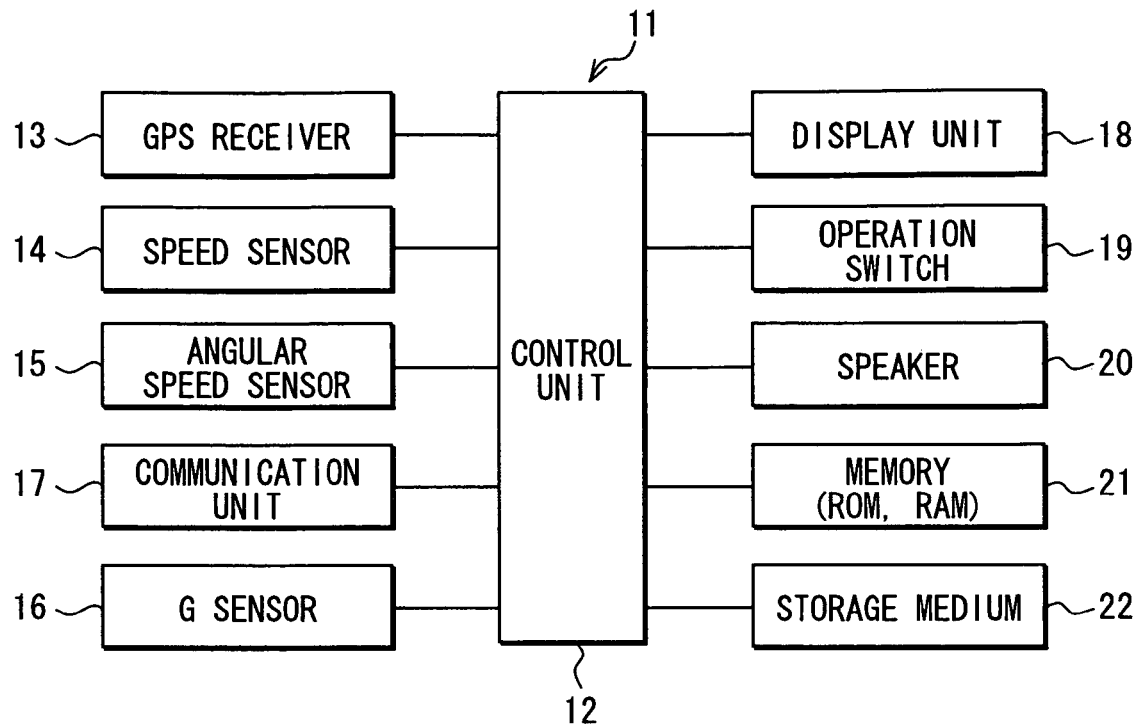
FIG. 1 shows a block diagram of an application control system in a first embodiment of the present disclosure.
FIG. 3 shows a table of relationship between regions and application types.

FIG. 1 shows a block diagram of the navigation system 11 in a first embodiment of the present disclosure. The block diagram shows an electrical connection between components in the navigation system 11. The navigation system 11 has a control unit 12 including a CPU, a ROM, a RAM, an interface circuit and programs for navigation functions stored therein for providing route navigation for a user based on a user input.

The control unit 12 has a connection to a GPS receiver 13 and various sensors such as a speed sensor 14, an angular speed sensor 15, a G sensor (an acceleration sensor) 16 and the like. The control unit 12 detects and calculates a current region (a current position) of the vehicle based on a GPS signal from a satellite received by the GPS receiver 13. The current position of the vehicle is accurately determined by employing signals from the speed sensor 14, the angular velocity sensor 15, the G sensor 16.

The control unit 12 also has a connection to a communication unit 17, a display unit 18, an operation switch 19, a speaker 20, a memory 21, and a storage medium 22. The storage medium 22 is used as a medium for provision of application software. The communication unit 17 has a function of a cellular phone for providing communication with an external network and the like. The display unit 18 has a liquid crystal display panel and the like for displaying a signal from the control unit 12. The display unit 18 also has a touch panel disposed thereon for implementing the operation switch 19. The operation switches 19 are also implemented as a mechanical switches arranged around the display unit 18.

The speaker 20 is used to output navigation guidance voice synthesized by the navigation system, and other guidance voices for notification or the like. The memory 21 is used to store setting information and other information. The memory 21 is also used to as a database for storing travel condition information. The memory 21 uses non-volatile memory device such as an EEPROM or the like for storing information. The storage medium 22 is, for example, information medium such as a CD-ROM, a DVD-ROM or the like for storing map data and-application software for displaying the map data. The information in the storage medium 22 is retrieved by using a data reader (not shown in the figure).

Figure 2:
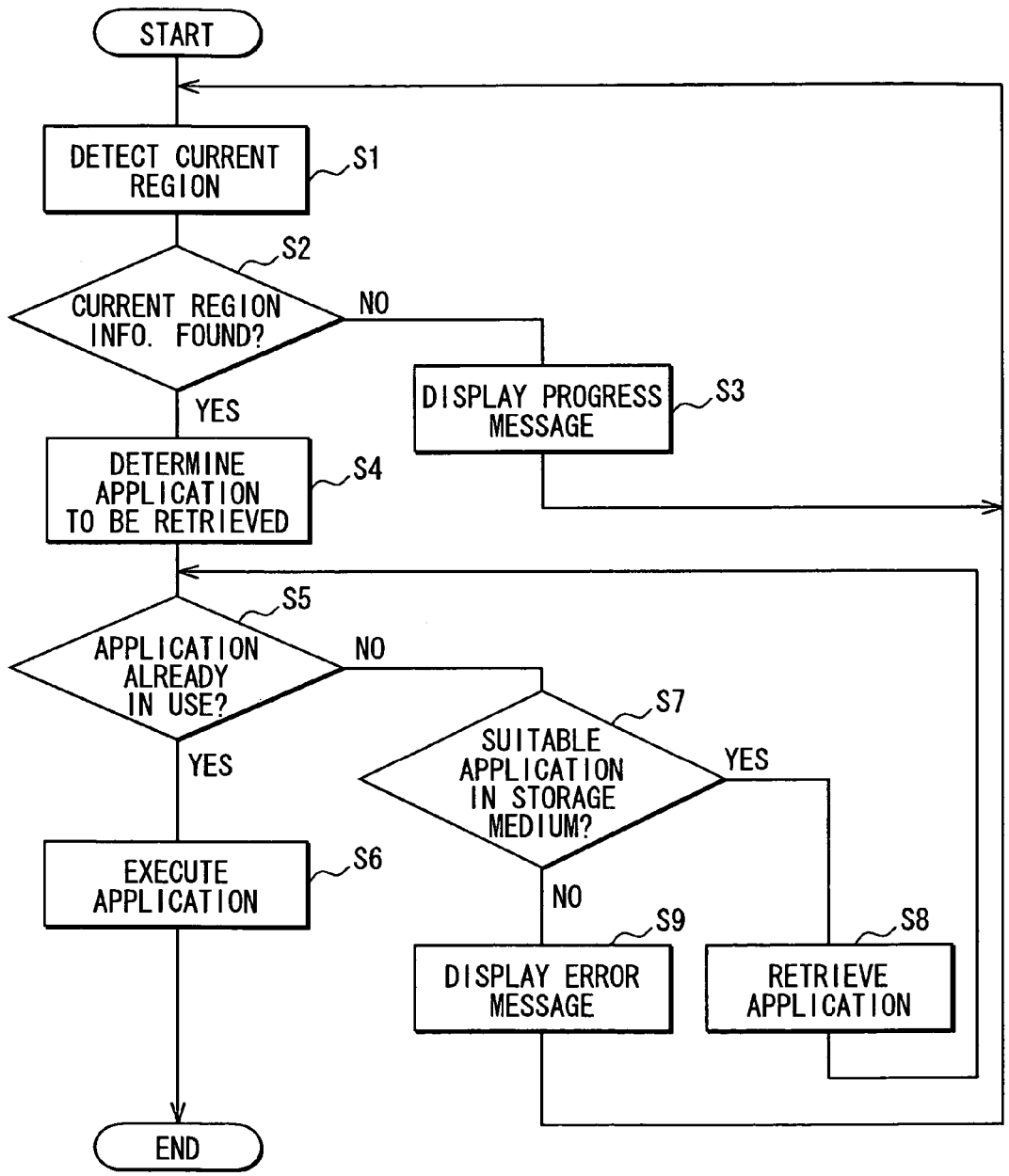
FIG. 2 shows a flowchart of a control process of the application control system.
Figure 4:
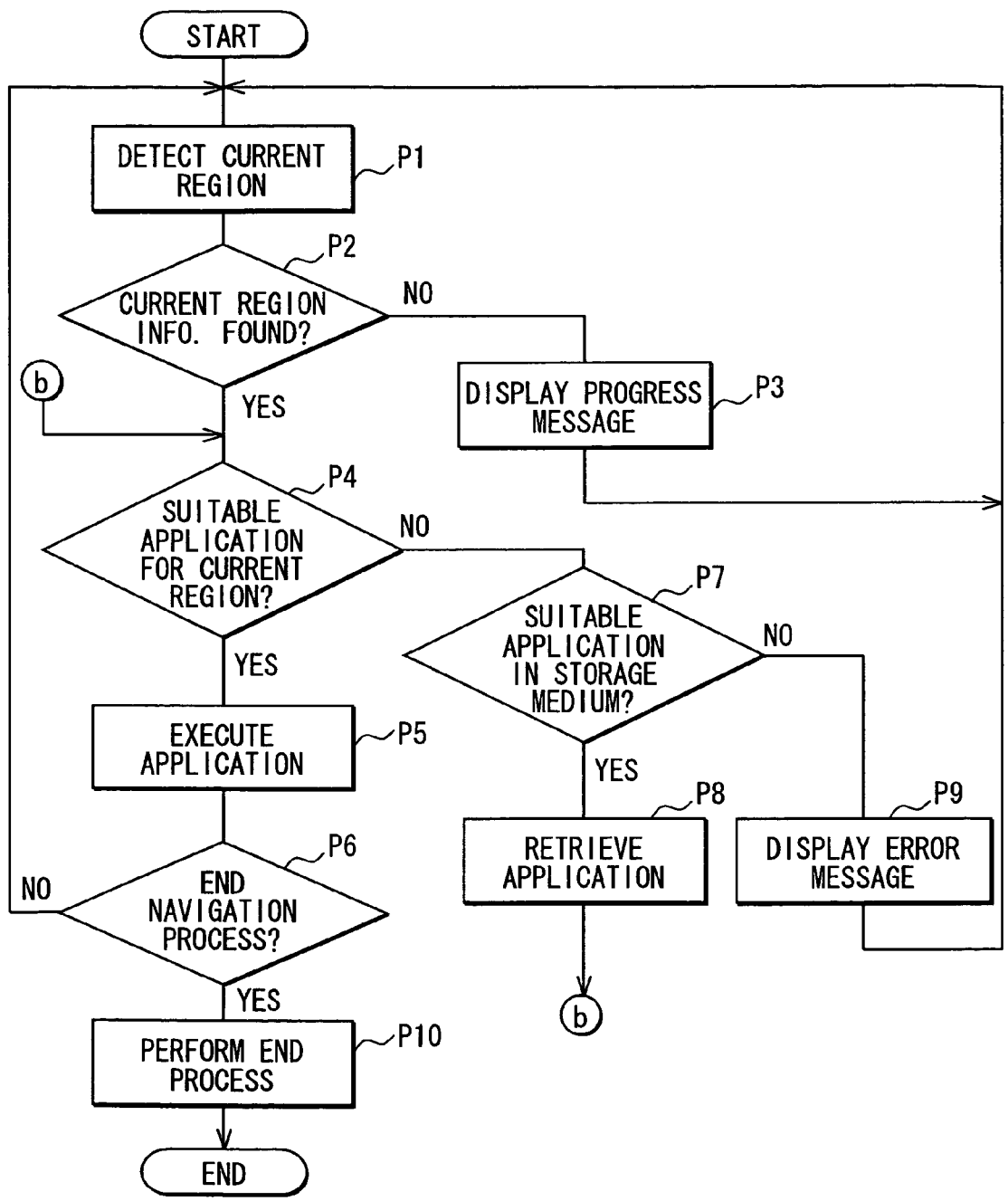
FIG. 4 shows a flowchart of the control process of the application control system in a traveling condition.

The operation of the navigation system 11 is described with reference to FIGS. 2 to 4. Functions of the navigation system 11 beside route navigation function accompanied by map display based on an inputted destination and a current position of the vehicle are omitted from the description for brevity, while characteristics of the present disclosure are described in detail in the following.

The navigation system 11 starts its operation in the following manner. That is, when a power of the navigation system 11 is turned on, the control unit 12 starts its operation and executes an operation instruction stored in a loader in the ROM of the memory 21. The execution process of the operation instruction is described as a flowchart in FIG. 2.

In step S1, the process in the control unit 12 detects a current position of the vehicle based on the GPS signal received by the GPS receiver 13. The current position is used to determine a current region where the vehicle is traveling. In steps S2 and S3, the process determines whether the current position is detected and displays a progress message on the display unit 18 during detection of the current position (step S2:NO). The process returns to step S1 after step S3. The process proceeds to step S4 when the current position is detected (step S2:YES).

In step S4, the process determines application software to be retrieved according to the current position detected in step S1. In this case, relationship between the current region and the application software are defined by, for example, a table shown in FIG. 3. That is, the region A is associated with the application software V1.5, the region B is associated with the application software V2.5, and the region C is associated with the application software V3.5. Each of the application software having various versions is stored in the storage medium 22.

In step S5, the process in the control unit 12 determines whether the application software already used in the navigation system 11 is in concord with the definition in the table in FIG. 3. The process proceeds to step S6 when the application software is already used in the navigation system 11 (step S5:YES). The process proceeds to step S7 when the application software in use is different from the definition (step S5:NO).

In step S6, the process executes the application software already in use.

In step S7, the process determines whether a suitable version of the application software is found in the storage medium 22. The process proceeds to step S8 when the suitable version in found in the storage medium 22. The process proceeds to step S9 when the suitable version is not found in the storage medium 22.

In step S8, the process retrieves the suitable application software and returns to step S5. After passing step S8, the determination in step S5 always becomes affirmative (YES), and the process proceeds to step S6.

In step S9, the process displays an error message for notifying a condition that the suitable software is not found in the storage medium 22 due to, for example, a mismatch, an absence of the medium 22 or the software on the medium 22. The process returns to step S1 after displaying the error message.

The operation of the navigation system 11 in a traveling condition is described with reference to a flowchart in FIG. 4. In this flowchart, the control process executed in parallel with a navigation function switches the application software that suitably handles the map data of a region where the vehicle is currently traveling so as to accommodate different map data format in each of the plural regions, that is, in each of the plural countries or the like when the vehicle is traveling across country borders.

In steps P1 to P3, the process detects and determines the current position of the vehicle as in steps S1 to S3 described before.

In step P4, the process determines whether the application software in use is suitable for the current region. The process proceeds to step P5 when the software is suitable (step P4:YES), and the process proceeds to step P7 when the software is not suitable (step P4:NO).

In steps P5 and P6, the process executes the application software and determines whether navigation process ends. The process proceeds to step P10 when the navigation process ends (step P6:YES), or the process returns to step P1 when the navigation process is not ending (step P6:NO).

In step P7, the process determines whether the suitable version of the application software is found in the storage medium 22. The process proceeds to step P8 when the suitable version in found in the storage medium 22. The process proceeds to step P9 when the suitable version is not found in the storage medium 22.

In step P8, the process retrieves the suitable application software and returns to step P4. After passing step P8, the determination in step P4 always becomes affirmative (YES), and the process proceeds to step P5.

In step P9, the process displays an error message for notifying a condition that the suitable software is not found in the storage medium 22 due to, for example, a mismatch, an absence of the medium 22 or the software on the medium 22. The process returns to step P1 after displaying the error message.

In step P10, the process performs an end process for ending the navigation process. In this manner, the application software is switched whenever the traveling vehicle causes change of the current region.

The navigation system 11 having the operation scheme of the above description is capable of retrieving the application software that is suitable for the current region when the navigation system 11 is turned on, and is capable of switching the application software when required application software is different from the current application software in use due to the travel of the vehicle across the boundary of the current region. Therefore, a single model of the navigation system 11 can be adaptively used in various regions and/or countries by switching the versions of the application software. In addition, manufacturing process of the navigation system 11 is simplified because of the decrease of the number of the models to cover different countries.

(Second Embodiment)

Figure 5:
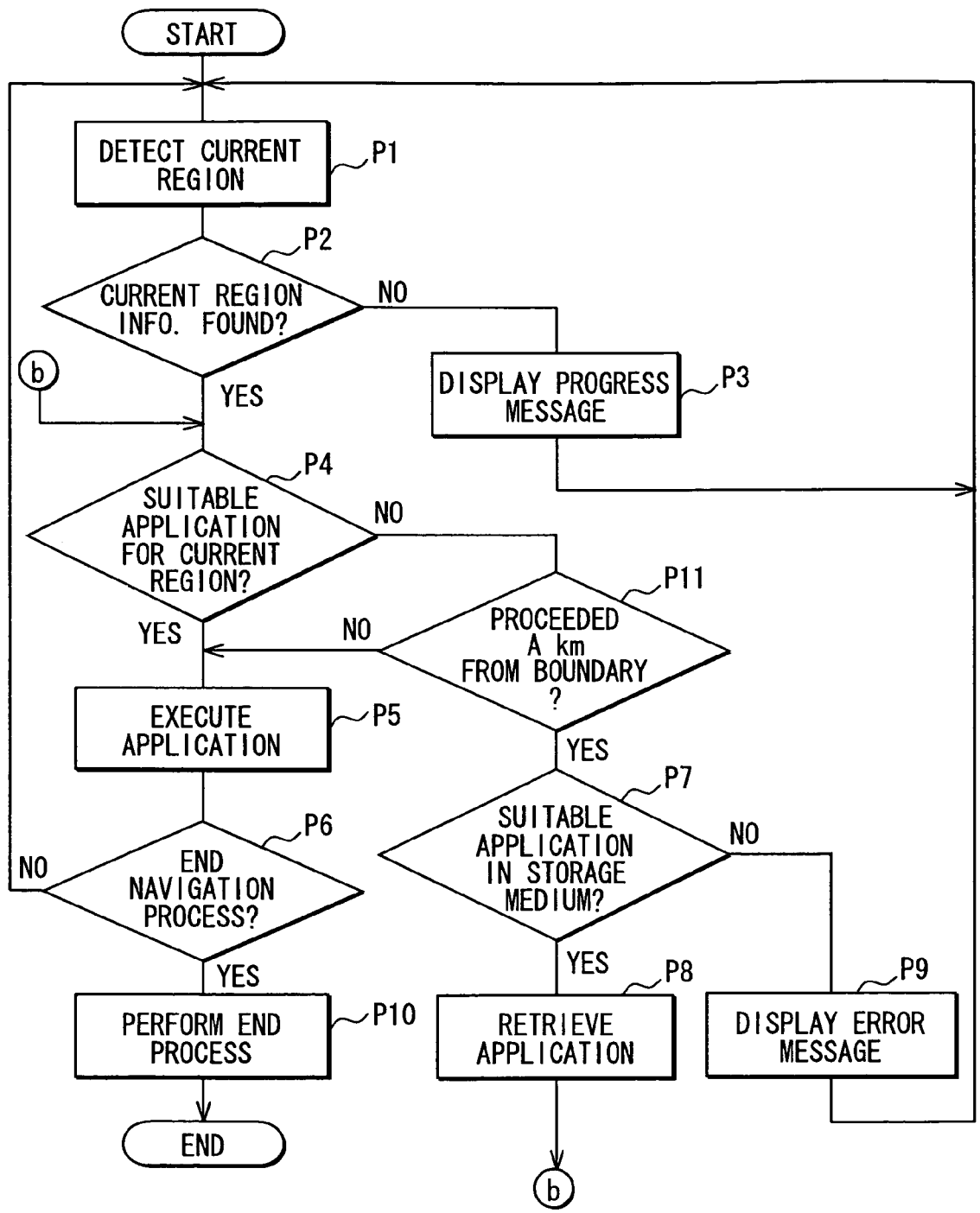
FIG. 5 shows a flowchart of the control process of the application control system in a traveling condition in a second embodiment.

FIG. 5 shows a flowchart of a control process in a second embodiment of the present disclosure. The description of the second embodiment is focused to a portion of the process that is different from the first embodiment.

The second embodiment assumes the travel of the navigation system 11 around the border of the different regions. That is, the travel of the navigation system 11 along a road that frequently crosses the border of the different regions causes a frequent switching of the application software, thereby causing an unstable condition in the navigation system 11.

Therefore, the process in FIG. 5 has an additional step P11 after the suitability of the application software is determined in step P4. Then, in step P11, the process determines whether the vehicle has proceeded for more than A km from the boundary of the region. The process proceeds to step P7 to switch the application software when the vehicle has proceeded for A km or more from the boundary (step P11:YES). The process proceeds to step P5 when the vehicle stays within the A km from the boundary (step P1:NO). In this manner, the control unit 12 stably controls the operation of the navigation system 11 when the vehicle travels along the boundary of the different regions.

(Third Embodiment)

Figure 6:
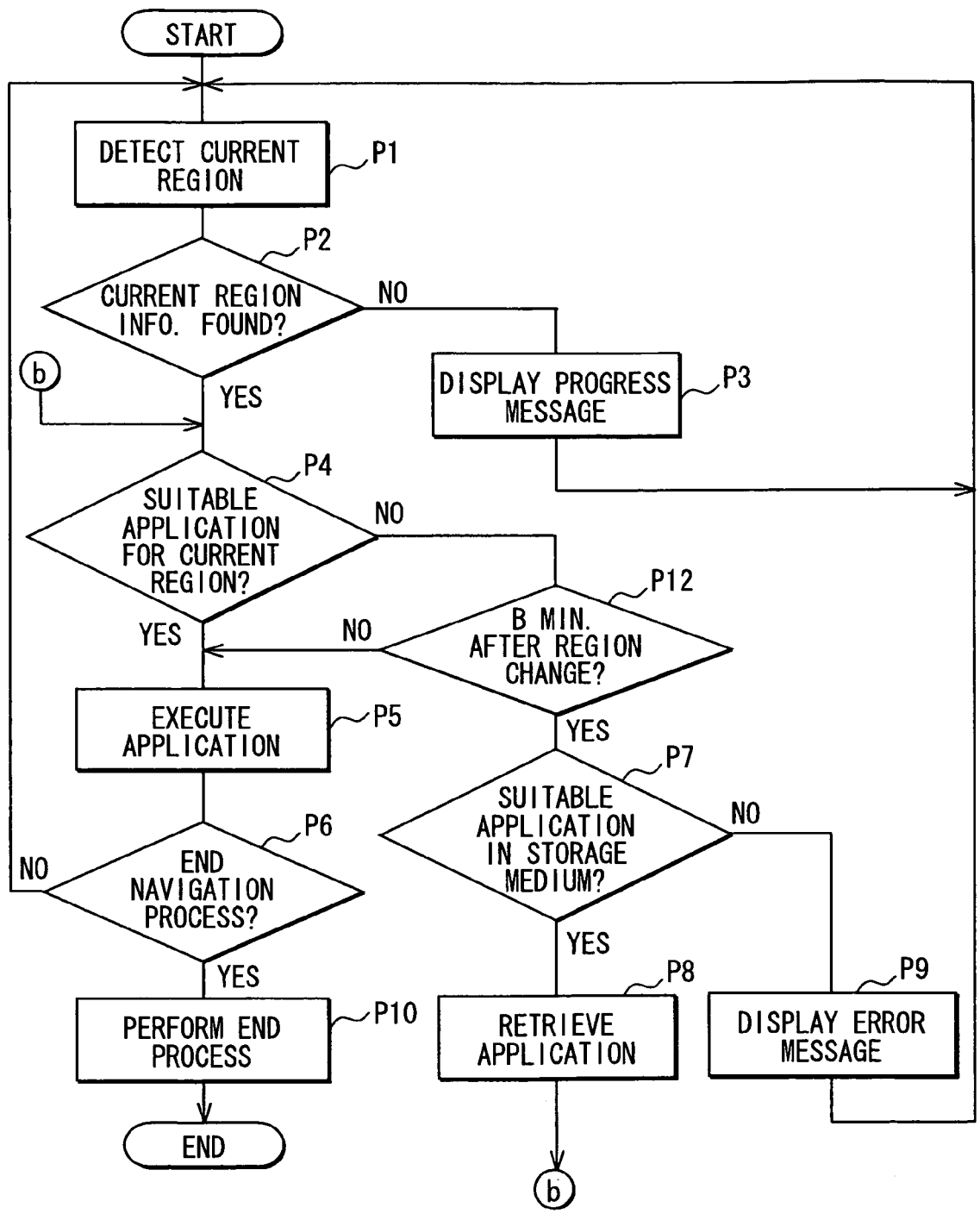
FIG. 6 shows a flowchart of the control process of the application control system in a traveling condition in a third embodiment.
Figure 7A:
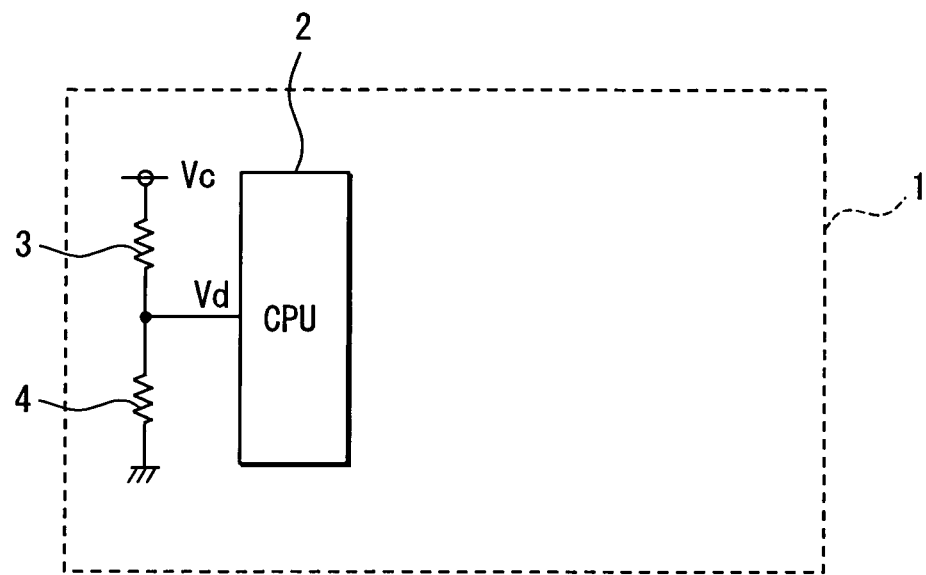
FIGS. 7A and 7B shows illustrations of a substrate in a conventional system.
Figure 7B:
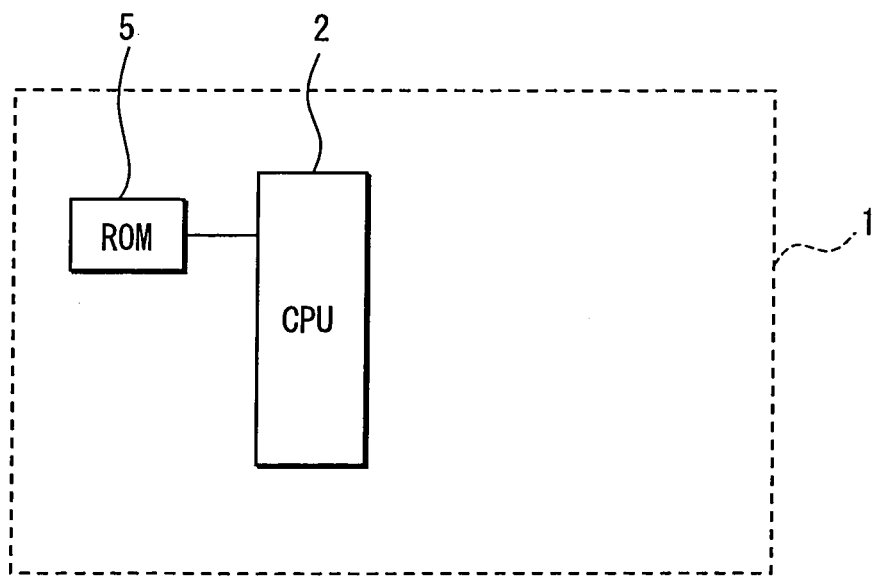

FIG. 6 shows a flowchart of a control process in a third embodiment of the present disclosure. The difference of the third embodiment from the second one exists in that the process determines whether the vehicle has proceeded B minutes after crossing the boundary. That is, in step P12, the process determines a travel time after crossing the boundary of the different regions. The process proceeds to step P7 when the travel time reaches a predetermined value (step P12:YES). The process proceeds to step P7 when the travel time is less than the predetermined value (step P12:NO).

In this manner, the control unit 12 can stably controls the operation of the navigation system 11 when the vehicle travels along the boundary of the different regions.

Although the present disclosure has been fully described in connection with the preferred embodiments thereof with reference to the accompanying drawings, it is to be noted that various changes and modifications will become apparent to those skilled in the art.

For example, the application software controlled by the application control system may not only control the map data, but also control information such as travel guide information and/or other additional information.

The current position of the vehicle may not necessarily be determined by the GPS signal, but may be detected and determined based on, for example, a signal that conveys positional information provided by an external source. Further, the current position is detected based on an address, a region name or the like.

The storage medium 22 may be different from the CD-ROM, the DVD-ROM or the like. That is, the storage medium 22 may be non-volatile memories such as a hard disk device, a flash memory device, or a storage device such as an IC card or the like. Further, the information may be stored in an external storage by using a radio communication or the like.

The application control system may also be applicable to a portable information terminal that is carried by a user, or applicable to a system such as a personal computer, a cellular phone or the like.

Further, use of a so-called hysteresis function for controlling the switching timing of the application software in the second and third embodiment may be selected by the user. The amount of the hysteresis may also be selected and/or determined by the user for the improved adaptability.

Such changes and modifications are to be understood as being within the scope of the present invention as defined by the appended claims.

What is claimed is:

1. An application control system for use in a navigation system of a vehicle comprising:
   a current region detector that detects a current region where the vehicle is operating;
   an application storage that stores in a retrievable manner, a plurality of map data handling software applications, each of the plurality of map data handling software applications being associated with a map data format from among a plurality of map data formats, each of a plurality of preset regions being associated with a map data format from among the plurality of map data formats; and
   a control unit, wherein
   the control unit determines if the current region is one of the plurality of preset regions, and when it is determined that the current region is one of the plurality of preset regions, the control unit determines a map data format associated with the current region, and further determines a map data handling software application associated with the map data format associated with the current region;

the control unit further determines whether the map data handling software application associated with the map data format associated with the current region is currently being executed by the control unit;

when the control unit determines that the map data handling software application associated with the map data format associated with the current region is currently being executed by the control unit, the control unit continues to execute the map data handling software application associated with the map data format associated with the current region;

when the control unit determines that the map data handling software application associated with the map data format associated with the current region is not currently being executed by the control unit, the control unit determines whether the map data handling software application associated with the map data format associated with the current region is stored in the application storage; and when the control unit determines that the map data handling software application associated with the map data format associated with the current region is stored in the application storage, the control unit retrieves and executes the map data handling software application associated with the map data format associated with the current region.

2. The application control system as in claim 1, wherein the control unit determines whether the map data handling software application associated with the map data format associated with the current region is currently being executed by the control unit at a time of a power-on operation of the application control system.

3. The application control system as in claim 1, wherein when the control unit determines that the map data handling software application associated with the map data format associated with the current region is not currently being executed by the control unit, prior to retrieving and executing the map data handling software application associated with the map data format associated with the current region, the control unit determines that the map data handling software application associated with the map data format associated with the current region is not currently being executed by the control unit for a predetermined period of time.

4. The application control system as in claim 3, wherein the predetermined period is defined as a period for a preset travel distance of the vehicle.

5. The application control system as in claim 3, wherein the predetermined period is defined as a preset amount of time.

6. The application control system as in claim 1, wherein the control unit executes the map data handling software application associated with the map data format associated with the current region by retrieving map data of the current region from an information medium and displaying the retrieved map data.

7. The application control system as in claim 1, wherein an error message is displayed when the map data handling software application associated with the current region is not stored in the application storage.

8. The application control system as in claim 1, wherein each map data format associated with a preset region represents map data of a geographic region such that the control unit determines a current vehicle position as the vehicle travels from one geographic region to another geographic region.

9. A method for controlling use of a plurality of regional map data handling software applications in a vehicle comprising:
providing a detecting unit;
providing a storage unit;
providing a control unit;
detecting by the detecting unit a current region where the vehicle is operating;
storing in the storage unit, in a retrievable manner, the plurality of regional map data handling software applications, each of the plurality of regional map data handling software applications being associated with a map data format from among a plurality of map data formats, each of a plurality of preset regions being associated with a map data format from among the plurality of map data formats;
determining by the control unit whether the current region is one of the plurality of preset regions,
when the control unit determines that the current region is one of the plurality of preset regions, determining by the control unit a map data format associated with the current region and a map data handling software application associated with the map data format associated with the current region;
determining by the control unit whether the map data handling software application associated with the map data format associated with the current region is currently being executed by the control unit;
when the control unit determines that the map data handling software application associated with the map data format associated with the current region is currently being executed by the control unit, continuing to execute by the control unit the map data handling software application associated with the map data format associated with the current region; and
when the control unit determines that the map data handling software application associated with the map data format associated with the current region is not currently being executed by the control unit, determining by the control unit whether the map data handling software application associated with the map data format associated with the current region is stored in the storage unit; and
when the control unit determines that the map data handling software application associated with the map data format associated with the current region is stored in the storage unit, retrieving and executing by the control unit the map data handling software application associated with the map data format associated with the current region.

10. The method as in claim 9, wherein the control unit determines whether the map data handling software application associated with the map data format associated with the current region is currently being executed by the control unit at a time of power-on operation of the application control system.

11. The method as in claim 9, wherein when the control unit determines that the map data handling software application associated with the map data format associated with the current region is not currently being executed by the control unit, prior to retrieving and executing the map data handling software application associated with the map data format associated with the current region, the control unit determines that the map data handling software application associated with the map data format associated with the current region is not currently being executed by the control unit for a predetermined period of time.

12. The method as in claim 11, wherein
the predetermined period is defined as a period for a preset travel distance of the vehicle.

13. The method as in claim 11, wherein
the predetermined period is defined as a preset amount of time.

14. The method as in claim 9, wherein
the control unit executes the map data handling software application associated with the map data format associated with the current region by retrieving map data of the current region from an information medium and displaying the retrieved map data.

15. The method as in claim 9, wherein
an error message is displayed when the map data handling software programs associated with the current region is not stored in the storage unit.

16. The method as in claim 9, wherein
each map data format associated with a preset region represents map data of a geographic region such that the control unit determines a current vehicle position as the vehicle travels from one geographic region to another geographic region.

17. An application control system for use in a plurality of regions, each of the plurality of regions being in association with a map data format from among a plurality of map data formats, the system comprising:
a control unit;
a current region detector for detecting a current region where the vehicle is operating;
an application storage for storing a plurality of map data handling software programs, each of the plurality of map data handling software programs being in association with a map data format from among the plurality of map data formats; and
a determination unit for determining a map data handling software program in association with a map data format in association with the detected current region, and for further determining whether the map data handling software program in association with the map data format in association with the detected current region is currently being executed by the control unit; wherein
when the determination unit determines that the map data handling software application in association with the map data format in association with the current region is not currently being executed by the control unit, the control unit determines whether the map data handling software application in association with the map data format in association with the current region is stored in the application storage; and
when the control unit determines that the map data handling software application in association with the map data format in association with the current region is stored in the application storage, the control unit retrieves and executes the map data handling software application in association with the map data format in association with the current region.

18. The application control system as in claim 17, wherein
the control unit executes the map data handling software application in association with the map data format in association with the current region by retrieving map data of the current region from an information medium and displaying the retrieved map data.

19. The application control system as in claim 17, wherein
an error message is displayed when the map data handling software program in association with the map data format in association with the current region is not stored in the application storage.

20. A method for controlling by a control unit a plurality of map data handling software programs, each of the plurality of map data handling software programs being associated with a map data format from among a plurality of map data formats, and each of a plurality of regions being associated with a map data format from among the plurality of map data formats, the method comprising:
detecting a current region where the vehicle is operating;
storing the plurality of map data handling software programs in a storage;
determining whether a map data handling software application associated with a map data format associated with the current region is currently being executed by the control unit; and
when it is determined that the map data handling software application associated with the map data format associated with the current region is not currently being executed by the control unit, the determining whether the map data handling software application associated with the map data format associated with the current region is stored in the storage; and
when it is determined that the map data handling software application associated with the map data format associated with the current region is stored in the storage, retrieving and executing by the control unit the map data handling software application associated with the map data format associated with the current region.

21. The method as in claim 20, wherein
the control unit executes the map data handling software application associated with the map data format associated with the current region by retrieving map data of the current region from an information medium and displaying the retrieved map data.

22. The method as in claim 20, wherein
an error message is displayed when the map data handling software application associated with map data format associated with the current region is not stored in the storage.

* * * * *